United States Patent [19]
Gilbert et al.

[11] Patent Number: 5,773,326
[45] Date of Patent: Jun. 30, 1998

[54] METHOD OF MAKING AN SOI INTEGRATED CIRCUIT WITH ESD PROTECTION

[75] Inventors: Percy V. Gilbert; Paul G. Y. Tsui, both of Austin; Stephen G. Jamison, Buda; James W. Miller, Austin, all of Tex.

[73] Assignee: Motorola, Inc., Schaumburg, Ill.

[21] Appl. No.: 710,702

[22] Filed: Sep. 19, 1996

[51] Int. Cl.$^6$ ............................................. H01L 21/786
[52] U.S. Cl. .......................... 438/154; 438/405; 438/981
[58] Field of Search ................................. 438/151, 154, 438/164, 405, 967, 981

[56] References Cited

U.S. PATENT DOCUMENTS

| | | | |
|---|---|---|---|
| 4,423,431 | 12/1983 | Sasaki | 357/41 |
| 4,753,896 | 6/1988 | Matloubian | 438/154 |
| 4,879,585 | 11/1989 | Usami | 357/49 |
| 4,889,829 | 12/1989 | Kawai | 438/405 |
| 5,013,681 | 5/1991 | Godbey et al. | 437/86 |
| 5,145,802 | 9/1992 | Tyson et al. | 437/63 |
| 5,364,800 | 11/1994 | Joyner | 437/28 |
| 5,399,507 | 3/1995 | Sun | 437/24 |
| 5,439,836 | 8/1995 | Giffard | 437/40 |
| 5,612,246 | 3/1997 | Ahn | 438/405 |

OTHER PUBLICATIONS

Mansun, Chan, et al., "SOI/Bulk Hybrid Technology on SIMOX Wafers for High Performance Circuits with Good ESC Immunity", pub. by IEEE Electron Device Ltrs., vol. 16, No. 1, Jan. 1995, pp. 11–13.

S.A. Abbas, et al., "Silicon–on–Sapphire–on–Silicon Integrated Circuit Structure", pub. by IBM Technical Discl. Bulletin, vol. 16, No. 3, Aug. 1973, pp. 1027–1029.

Jean–Pierre Colinge, "Silicon–on–Insulator Technology: Materials to VLSI", Kluwer Academic Publishers 1991, Chapter 4:SOI CMOS Technology, pp. 102–106.

Stanley Wolf, "Silicon Processing for the VLSI Era", Lattice Press in California, vol. 2: Process Integration, 4 pgs., 1990, pp. 72–75.

Gilbert et al., Application #08/384,177 filed Feb. 6, 1995.

Smith et al., Application #08/625,861 filed Apr. 1, 1996.

*Primary Examiner*—Chandra Chaudhari
*Attorney, Agent, or Firm*—George R. Meyer

[57] ABSTRACT

An SOI structure (20) includes a semiconductor layer (15) formed on an insulating substrate (12). The semiconductor layer (15) is partitioned into an ESD protection portion (32) and a circuitry portion (34). A portion of the semiconductor layer (15) in the ESD protection portion (32) and a different portion of the semiconductor layer (15) in the circuitry portion (34) are differentially thinned. A device (60) which implements the desired circuit functions of the SOI structure (20) is fabricated in the circuitry portion (34). An ESD protection device (40) is fabricated in the ESD protection portion (32). The thick semiconductor layer (15) in the ESD protection portion (32) serves to distribute the ESD current and heat over a large area, thereby improving the ability of the SOI structure (20) to withstand an ESD event.

13 Claims, 2 Drawing Sheets

METHOD OF MAKING AN SOI INTEGRATED CIRCUIT WITH ESD PROTECTION

BACKGROUND OF THE INVENTION

The present invention relates, in general, to semiconductor devices and, more particularly, to semiconductor on insulator semiconductor devices.

In very large scale integrated (VLSI) circuits, semiconductor on insulator and, more particularly, thin film silicon on insulator (TFSOI) technology is used to achieve greater isolation between devices without reducing available chip area. Further, TFSOI technology is ideally suited for fabricating high speed semiconductor devices that are radiation hardened and resistant to latch up. Similar to semiconductor devices manufactured in bulk silicon, TFSOI semiconductor devices include electrostatic discharge (ESD) protection circuitry. This ESD circuitry is designed to turn on only during an ESD event thereby providing a robust low resistance current path. In bulk silicon, heat generated during the brief ESD event is dissipated in the underlying silicon substrate. In TFSOI technology, however, the poor thermal conductivity of an underlying oxide leads to an increased rate of heating in the ESD protection circuitry. This enhanced heating increases the probability of an ESD event occurring in a device manufactured in TFSOI technology.

One approach for providing adequate ESD protection involves fabricating devices using a hybrid TFSOI and bulk semiconductor substrate. The TFSOI portion of the hybrid substrate is used for fabricating devices that implement the desired circuit functions, and the bulk semiconductor portion of the hybrid substrate is used for fabricating ESD protection devices which provide the ESD protection for the devices in the TFSOI portion of the substrate. However, fabricating the hybrid substrate is complicated and optimizing the turn-on voltage of an ESD protection device fabricated in the bulk portion of the hybrid substrate is a difficult process.

Accordingly, it would be advantageous to have a semiconductor on insulator structure capable of providing adequate ESD protection capability. It would be of further advantage for the structure to be area efficient and the process of fabricating the structure to be simple and easily integrated into existing semiconductor processes. Further, it is desirable for the semiconductor on insulator substrate to readily permit optimization of ESD circuit parameters such as turn-on voltage.

DETAILED DESCRIPTION

The present invention relates to a semiconductor on insulator (SOI) integrated circuit with electrostatic discharge (ESD) protection. The semiconductor layer of the SOI substrate is differentially thinned resulting in the semiconductor layer having a thicker portion and a thinner portion. The devices that implement the circuit functions of the SOI structure are fabricated in the thinner portion of the semiconductor layer of the SOI substrate, whereas an ESD protection device is fabricated in the thicker portion of the semiconductor layer of the SOI substrate. As described hereinafter, the thick semiconductor film in the second portion provides better ESD protection by spreading current and dissipating heat over a large area during an ESD event. Therefore, hybrid TFSOI is not required. Embodiments of the present invention have the benefits of the bulk substrate ESD device without the complications of the hybrid TFSOI.

Figure 1:
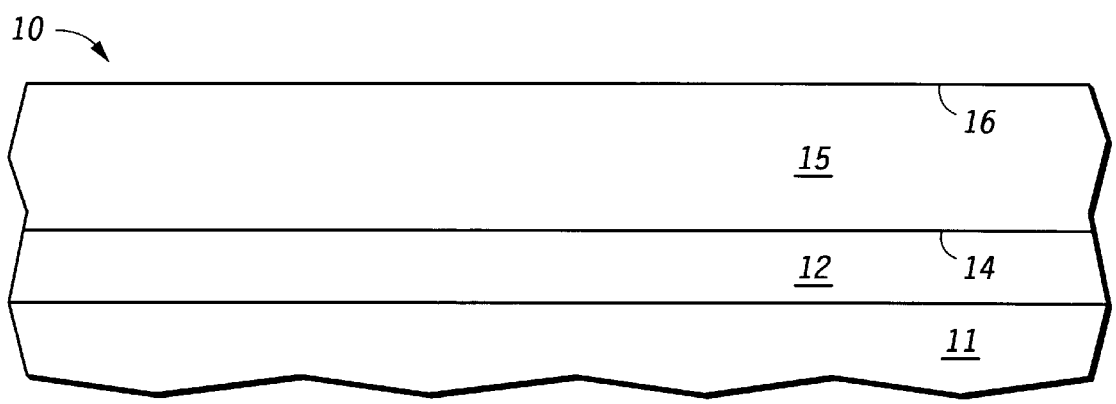
FIG. 1 is an enlarged cross-sectional view of an SOI substrate such as would be used to fabricate an SOI structure in accordance with the present invention.

FIG. 1 is an enlarged cross-sectional view of an SOI substrate 10 for fabricating an SOI structure in accordance with the present invention. SOI substrate 10 includes a semiconductor substrate layer 11, an insulating layer 12, and a semiconductor layer 15. In this embodiment, the insulating layer is a silicon dioxide layer. The combination of the semiconductor substrate 11 and insulating layer 12 form an insulating substrate that has a major surface 14. The semiconductor layer 15 overlies major surface 14 and is p-type monocrystalline silicon layer. By way of example, semiconductor layer 15 has a surface 16 and a thickness of 300 nanometers (nm). SOI substrate 10 can be formed using any of the conventional processes known in the art such as, for example, oxygen implantation or direct wafer bonding and thinning.

Figure 2:
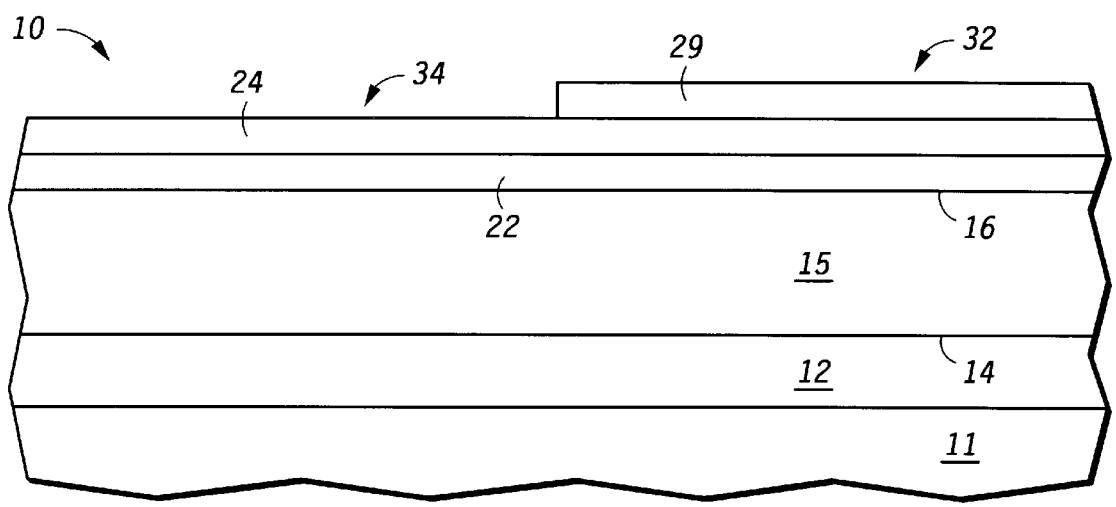
FIGS. 2–5 are enlarged cross-sectional views of an SOI structure at various stages of fabrication in accordance with the present invention.

A pad layer 22 and an oxidation-resistant layer 24 are formed over the SOI substrate 10 as shown in FIG. 2 during the formation of an SOI structure 20 in accordance with the present invention. The pad layer 22 includes silicon dioxide and can be formed by thermally oxidizing the semiconductor layer 15 or depositing an oxide layer over the semiconductor layer 15. The oxidation-resistant layer 24 includes silicon nitride and is typically formed by deposition. If pad layer 22 is formed by thermal oxidation, semiconductor layer 15 becomes thinner. By way of example, pad layer 22 has a thickness of approximately 40 nm, the oxidation-resistant layer is approximately 90 nm, and the semiconductor layer 15 is thinned to a thickness of approximately 280 nm.

A masking layer 29 such as, for example, a photoresist layer, is formed on the oxidation-resistant layer 24. Masking layer 29 is patterned to cover and protect oxidation-resistant layer 24 and pad layer 22 over an ESD protection portion 32 of semiconductor layer 15 and absent from a protected circuitry portion 34 of semiconductor layer 15. Techniques for patterning photoresist masking layer 29 are well known to those skilled in the art. Preferably, SOI structure 20 includes a plurality of ESD protection portions, such as ESD protection portion 32, arranged around the periphery of SOI structure 20. An ESD protection device is fabricated in each ESD protection portion. Semiconductor devices that implement the circuit functions such as, for example, NAND, NOR, OR, EXCLUSIVE-OR, operational amplifiers, of SOI structure 20 are formed in protected circuitry portion 34. Therefore, semiconductor devices within the protected circuit portion 34 are protected devices.

Figure 3:
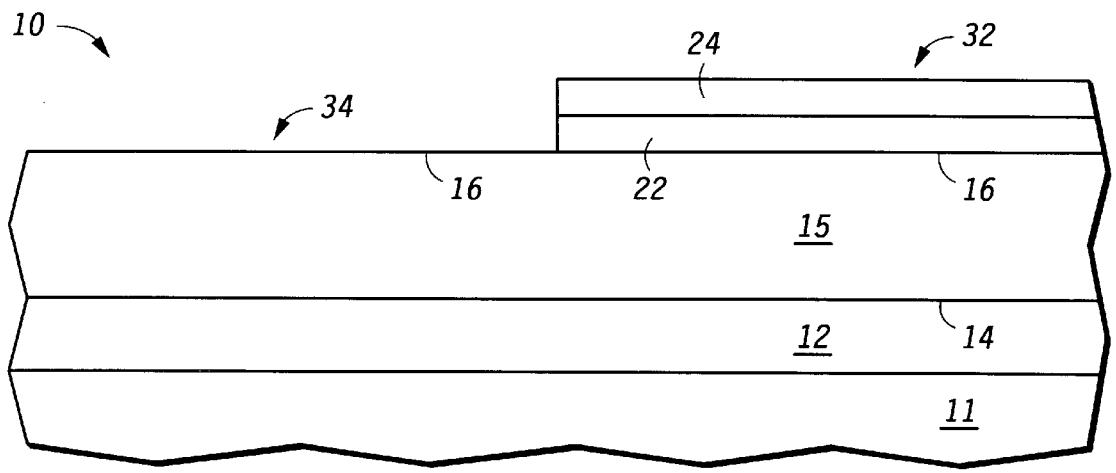

FIG. 3 is an enlarged cross-sectional view of SOI structure 20 at a subsequent stage of fabrication in accordance with the present invention. The portions of oxidation-resistant layer 24 and pad layer 22 in the regions not covered or protected by masking layer 29 are removed using, for example, reactive ion etching. After etching, masking layer 29 is removed using techniques known in the art. It should be noted that removing pad layer 22 is optional. In an alternative embodiment, the etching process only removes oxidation-resistant layer 24 in the regions unprotected by masking layer 29.

Figure 4:
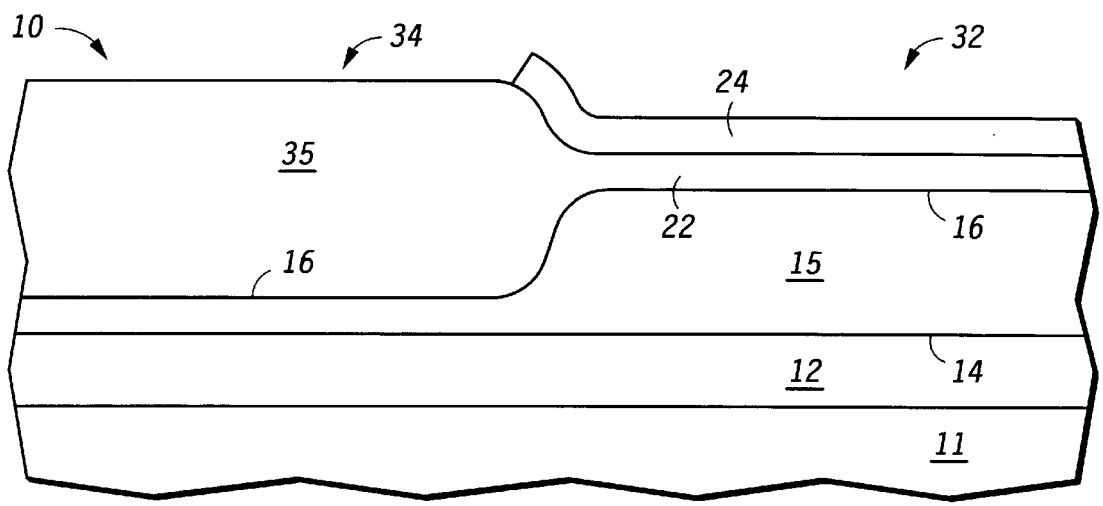

Referring now to FIG. 4, an insulating layer 35 including silicon dioxide is formed over the exposed portions of surface 16 by thermally oxidizing a portion, but not all the thickness of semiconductor layer 15 within the protected circuitry portion 34. The portion of the oxidation-resistant layer 24 is an oxidation mask during the thermal oxidizing step that forms the insulating layer 35. Formation of oxide layer 35 consumes the portions of semiconductor layer 15 unprotected by oxidation-resistant layer 24. Thus, semiconductor layer 15 in protected circuitry portion 34 is thinned by the oxidation process. The surface of semiconductor layer 15 in the thinned portion is still indicated by reference number 16. By way of example, insulating layer 35 over protected circuitry portion 34 of semiconductor layer 15 has a thickness of approximately 360 nm and semiconductor layer 15 in protected circuitry portion 34 is thinned to have a thickness of approximately 100 nm.

Figure 5:
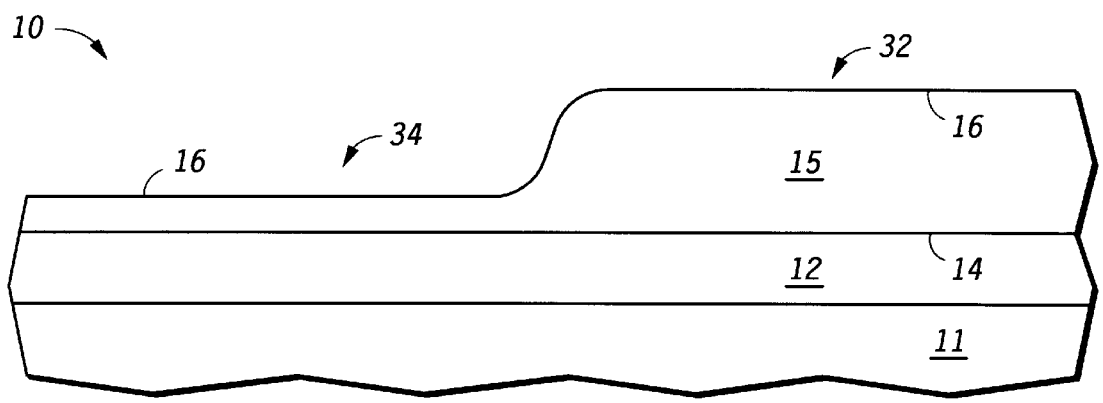

The insulating layer 35 and remaining portions of the oxidation-resistant layer 24 and pad layer 22 are removed as shown in FIG. 5. Layers 22, 24, and 35 are removed by etching, such as reactive ion etching, wet chemical etching, or the like.

The present invention is not limited to the specific numbers presented regarding the embodiment of FIGS. 1–5. Insulating layer 12 includes silicon dioxide, silicon nitride, or the like and has a thickness in a range of approximately 300–1000 nm. Before forming the pad layer 22, the semiconductor layer 15 has a thickness in a range of approximately 150–500 nm.

Pad layer 22 includes silicon dioxide or a combination of a silicon dioxide layer and a semiconductor layer over the silicon dioxide layer. The thickness of the pad layer 22 is typically in a range of approximately 10–100 nm. The oxidation-resistant layer 24 has a thickness that virtually prevents the underlying portion of the semiconductor layer 15 from being oxidized when insulating layer 35 is formed. The oxidation-resistant layer 24 typically has a thickness in a range of approximately 40–100 nm.

An embodiment of the present invention provides a process for thinning the semiconductor layer 15 within the protected circuitry portion 34 without significantly affecting the thickness of the semiconductor layer 15 within the ESD protection portion 32. Depending on the types of semiconductor devices to be fabricated, the thickness of semiconductor layer 15 and the thickness of oxide layers 22 and 35 vary from process to process. In thin film silicon on insulator technology, semiconductor layer 15 in protected circuitry portion 34 typically has a thickness ranging from approximately 50–150 nm. If fully depleted devices are formed within protected circuitry portion 34, the semiconductor layer 15 typically has a thickness no greater than approximately 100 nm.

An ESD protection device is fabricated in ESD protection portion 32 and low-potential semiconductor devices for implementing circuit functions (e.g., NAND, NOR, OR, amplifiers, etc.) are fabricated in protected circuitry portion 34 of SOI substrate 20. As used in this specification, low-potential semiconductor devices are devices that normally operate at a potential less than 3.0 volts. Digital logic circuits typically are formed within protected circuitry portion 34. Examples of device structures that can be fabricated in protected circuitry portion 34 of semiconductor layer 15 include field effect transistors, bipolar transistors, resistors, capacitors, inductors, etc.

Figure 6:
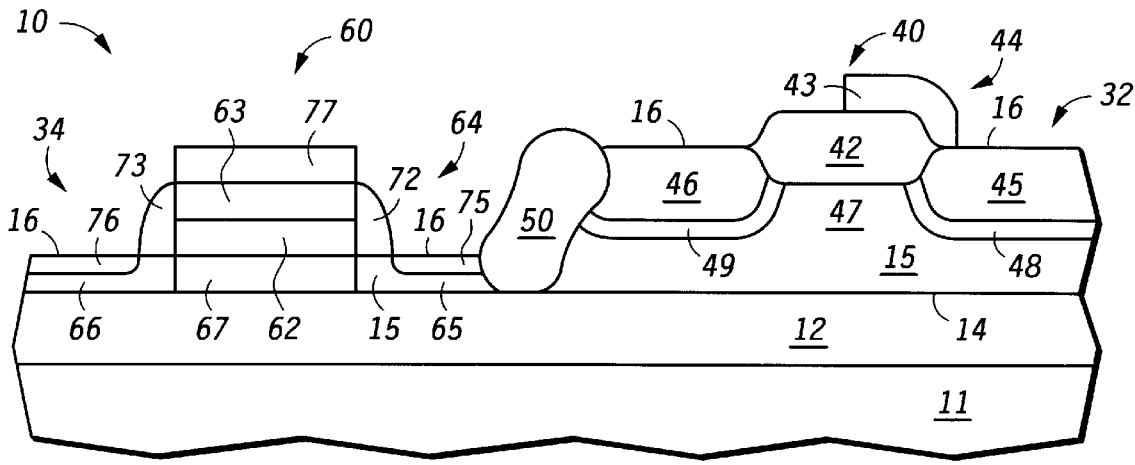
FIG. 6 is an enlarged cross-sectional view of an SOI structure having an ESD protection device formed thereon in accordance with the present invention.

As an example, FIG. 6 illustrates an enlarged cross-sectional view of an ESD protection device 40 fabricated in ESD protection portion 32 and an n-channel insulated gate field effect transistor (FET) 60 fabricated in protected circuitry portion 34. The formation of the ESD protection device 40 and FET 60 is described below.

A dopant of p-conductivity type such as, for example, boron, is implanted into the semiconductor layer 15 of ESD protection portion 32 and protected circuitry portion 34. The energy and dose of the implanted boron ions are adjusted so that the silicon material in semiconductor layer 15 has a dopant concentration ranging, for example, from approximately $10^{15}$ atoms per cubic centimeter (atoms/cm$^3$) to approximately $10^{18}$ atoms/cm$^3$. Although the concentration of the p-type dopant in ESD protection portion 32 and the concentration of the p-type dopant in protected circuitry portion 34 are described as being the same, this is not a limitation of the present invention. Alternatively, semiconductor layer 15 could have a p-type dopant concentration of approximately $10^{15}$ to $10^{18}$ atoms/cm$^3$ before forming the pad layer 22.

Field isolation regions 42 and 50 are formed in semiconductor layer 15 using a conventional local oxidation of silicon (LOCOS) process to a thickness in a range of approximately 200–700 nm. Field isolation region 42 serves as a gate dielectric of ESD protection device 40 and will subsequently be referred to as gate dielectric 42. Preferably, gate dielectric 42 is thicker than a gate dielectric of a conventional field effect transistor. Thus, ESD protection device 40 is also referred to as a thick field oxide ESD protection device. Field isolation region 50 forms a local isolation structure that separates ESD protection portion 32 from protected circuitry portion 34. The field isolation region 50 contacts the insulating layer 12. Referring to FIG. 6, the ESD protection portion 32 includes a thick semiconductor island, and the protected circuit portion includes a thin semiconductor island, where the field isolation region 50 separates and electrically isolates the semiconductor islands from each other. The ESD protection portion 32 and the protected circuit 34 are also electrically isolated from the semiconductor substrate layer 11 by insulating layer 12. In a preferred embodiment, gate dielectric 42 and field isolation region 50 are formed in one oxidation step, thereby simplifying the fabrication process.

A gate dielectric layer 62 is formed in circuitry portion 34 of semiconductor layer 15. Gate dielectric layer 62 includes oxide, nitride, a nitrided oxide, or the like and has a thickness in a range of approximately 5–15 nm. A conductive layer such as, for example, a polycrystalline silicon layer 43 of n-conductivity type, is formed on gate dielectric 42 of ESD protection device 40. Gate dielectric 42 and polycrystalline silicon layer 43 form a gate structure 44 of ESD protection device 40. Likewise, a conductive layer such as, for example, a polycrystalline silicon layer 63 of n-conductivity type, is formed on gate dielectric layer 62 of FET 60. Gate dielectric layer 62 and polycrystalline silicon layer 63 form a gate structure 64 of FET 60.

A dopant of n-conductivity type such as, for example, arsenic, is implanted into portions of ESD protection portion 32 adjacent the edges of gate structure 44 and portions of protected circuitry portion 34 adjacent the edges of gate structure 64 to form the source and drain regions of ESD protection device 40 and FET 60, respectively. The energy and dose of the implanted arsenic ions are adjusted so that the source and drain regions have a dopant concentration ranging, for example, from approximately $10^{18}$ atoms/cm$^3$ to approximately $10^{21}$ atoms/cm$^3$. Source region 45 of ESD protection device 40 is electrically connected to polycrystalline silicon layer 43.

A channel region 47 of ESD protection device 40 lies between source region 45 and drain region 46 of ESD protection device 40. Likewise, a channel region 67 of FET 60 lies between source region 65 and drain region 66 of FET 60. Source region 45 of ESD protection device 40 extends into semiconductor layer 15 from surface 16. Similarly, drain region 46 of ESD protection device extends into semiconductor layer 15 from surface 16. Preferably, the junction depths of source region 45 and drain region 46 of ESD protection device 40 are less than the thickness of semiconductor layer 15 in ESD protection portion 32. Typically, each of the source regions 45 and 65 and the drain regions 46 and 66 has a depth in a range of approximately 100–200 nm. The volume of the semiconductor layer 15 under ESD protection device 40 provides an increased heat dissipation capability compared with a conventional TFSOI field effect transistor structure. Thus, the heat generated during an ESD event is dissipated efficiently over a larger volume. Further, the portion of the semiconductor layer 15 under source and drain regions 45 and 46 provides ESD protection device 40 with an increased junction area compared with a conventional TFSOI field effect transistor structure. Thus, the current is distributed over a large area during an ESD event.

On the other hand, source region 65 and drain region 66 of FET 60 preferably extend from surface 16 of semiconductor layer 15 within the protected circuitry portion 34 to major surface 14 of insulating layer 12. By way of example, the thickness of semiconductor layer 15 in ESD protection portion 32 is approximately 280 nm and the junction depths of source region 45 and drain region 46 of ESD protection device 40 are approximately 150 nm. The thickness of semiconductor layer 15 within protected circuitry portion 34 is approximately 100 nm. Thus, the source and drain regions, 45 and 46, respectfully, of ESD protection device 40 extend into semiconductor layer 15 to a depth which is less than the thickness of semiconductor layer 15 in ESD protection portion 32.

A source side halo region 48 and a drain side halo region 49 are formed under source region 45 and drain region 46 of ESD protection device 40, respectively, by implanting a dopant of p-conductivity type. The energy and dose of the implanted ions are adjusted so that halo regions 48 and 49 have a dopant concentration ranging, for example, from approximately $10^{16}$ atoms/cm$^3$ to approximately $10^{20}$ atoms/cm$^3$. Halo regions 48 and 49 preferably have a higher dopant concentration than that in channel region 47. Halo regions 48 and 49 serve to set the turn-on voltage of ESD protection device 40, thereby optimizing the performance of ESD protection device 40. Although preferred, halo regions 48 and 49 are optional in forming ESD protection device 40.

Insulating structures such as, for example, insulating spacers 72 and 73, are formed adjacent gate structure 64 of FET 60. A source electrode 75 is formed in source region 65 adjacent oxide spacer 72. A drain electrode 76 is formed in drain region 66 adjacent oxide spacer 73. A gate electrode 77 is formed on polycrystalline silicon layer 63. By way of example, source electrode 75, drain electrode 76, and gate electrode 77 are silicide structures that are formed using a conventional self-aligned silicide process. A blocking layer may be formed over the ESD protection device 40 before performing the silicide process to prevent silicide structures from being formed.

ESD protection device 40 provides ESD protection for the devices formed in circuitry portion 34, e.g., FET 60. Because the junction depths of source and drain regions 45 and 46 are less than the thickness of semiconductor layer 15 in ESD protection portion 32, ESD current flowing from drain region 46 to source region 45 is also conducted along the bottom edges of the junctions. Therefore, the volume of the semiconductor layer 15 under ESD protection device 40 provides an increased heat dissipation capability compared with a conventional TFSOI field effect transistor structure. Thus, the heat generated during an ESD event is dissipated efficiently over a larger volume. The current density and therefore the rate of heating, is reduced. Further, the heat generated during an ESD event is dissipated efficiently over a larger volume. Note that the protected circuitry portion 34 does not include any ESD devices.

Halo regions 48 and 49 serve to adjust the turn-on voltage of ESD protection device 40. The turn-on voltage is the voltage across drain region 46 and source region 45 at which ESD protection device 40 becomes conductive and starts to dissipate the electrostatic charge. In order to provide effective device protection, the turn-on voltage of ESD protection device 40 is preferably lower than the break-down voltage of the devices in circuitry portion 34 such as, for example, FET 60. A heavier dopant concentration of the halo regions 48 and 49 turns on the ESD protection device 40 at a lower voltage compared to a lighter dopant concentration. The dopant concentration in halo regions 48 and 49, the junction depths of source and drain regions 45 and 46, the thickness of semiconductor layer 15 in ESD protection portion 32, the thickness of gate oxide 42, and the size and shape of polycrystalline silicon layer 43 can be adjusted to optimize the performance of ESD protection device 40. Details on thicknesses, dopant concentrations, and junction depths have been previously discussed.

An SOI structure with ESD protection and a method for fabricating the SOI structure have been provided. The structure includes an ESD protection device which is able to distribute ESD current and heat over a large region, thereby avoiding heat damage. The ESD protection device of the present invention is a field effect transistor and is area efficient. The turn-on voltage of the ESD protection device can be easily optimized by adjusting the dopant concentration of the halo regions 48 and 49 in the ESD protection device 40. Furthermore, the structure of the present invention can be fabricated from a standard SOI substrate using conventional SOI processing techniques. Therefore, fabrication of the semiconductor devices of the present invention is simple, cost efficient, and easily integrated into existing SOI processes.

While specific embodiments of the invention have been shown and described, further modifications and improvements will occur to those skilled in the art. It is understood that this invention is not limited to the particular forms shown and it is intended for the appended claims to cover all modifications of the invention that fall within the scope of the invention. For example, the semiconductor on insulator layer may be semiconductor on sapphire.

We claim:

1. A process for forming an integrated circuit comprising the steps of:

providing an SOI substrate which has a semiconductor layer over an insulating layer, the semiconductor layer having a first thickness;

forming a pad layer over the semiconductor layer;

forming an oxidation-resistant layer over the pad layer;

patterning the oxidation-resistant layer to remove a portion of the oxidation-resistant layer that overlies a first portion of the semiconductor layer while leaving a remaining portion of the oxidation-resistant layer over the second portion of the semiconductor layer;

thermally oxidizing the first portion of the semiconductor layer to form an oxide layer over the first portion and thin the first portion such that the first portion of the semiconductor layer is thinner than a second portion of the semiconductor layer; and forming a first device and an ESD protection device, wherein the first device is formed within the first portion of the semiconductor layer and the ESD protection device is formed within the second portion of the semiconductor layer.

2. The process of claim 1, further comprising the steps of:

removing the remaining portion of the oxidation-resistant layer after the step of thermally oxidizing; and removing the pad layer and oxide layer that overlies the semiconductor layer after the step of removing the remaining portion of the oxidation-resistant layer.

3. The process of claim 1, further comprising the step of forming a field isolation region to electrically isolate the first portion of the semiconductor layer from the second portion of the semiconductor layer.

4. The process of claim 3, wherein:

the step of forming a field isolation region also forms a dielectric for the ESD protection device within the second portion; and the process further includes steps of:

forming a gate dielectric layer over the first portion, wherein the gate dielectric layer is thinner than the dielectric for the ESD protection device;

forming a conductive layer over the gate dielectric layer and the dielectric for the ESD protection device;

patterning the conductive layer to form a gate for the first device and a gate for the ESD protection device; and forming source and drain regions for the first device and ESD protection device, wherein the source and drain regions have a conductivity type opposite the semiconductor layer.

5. The process of claim 4, wherein:

the step of providing is performed such that the first thickness is no thicker than 500 nm; and the step of forming the source and drain regions is performed such that each of the source and drain regions has a depth in a range from approximately 100–200 nm.

6. The process of claim 4, wherein the step of forming the first device and the ESD protection device further comprises a step of forming a source side halo region and a drain side halo region, wherein:

the source side halo region lies within in the second portion of the semiconductor layer adjacent the source region of the ESD protection device;

the drain side halo region lies within the second portion of the semiconductor layer adjacent the drain region of the ESD protection device; and the source side halo region and the drain side halo region have a conductivity type opposite the source and drain regions of the ESD protection device.

7. The process of claim 4, further comprising a step of implanting ions into the second portion of the semiconductor layer after the step of thermally oxidizing, wherein the ions have a conductivity type opposite that of the source and drain regions.

8. The process of claim 4, wherein the source region of the ESD protection device is electrically connected to the gate of the ESD protection device.

9. The process of claim 1, wherein the step of forming the pad layer comprises steps of:

forming a silicon dioxide layer over the semiconductor layer; and forming a second semiconductor layer over the silicon dioxide layer.

10. A process for forming an integrated circuit comprising the steps of:

providing an SOI substrate which has a semiconductor layer over an insulating layer, the semiconductor layer having a first thickness;

forming a pad layer over the semiconductor layer;

forming an oxidation-resistant layer over the pad layer;

patterning the oxidation-resistant layer to remove a portion of the oxidation-resistant layer that overlies a first portion of the semiconductor layer while leaving a remaining portion of the oxidation-resistant layer over the second portion of the semiconductor layer;

thermally oxidizing the first portion of the semiconductor layer to form an oxide layer over the first portion, wherein the first portion has a thickness no greater than approximately 150 nm and a second portion of the semiconductor layer has a thickness thicker than the first portion but no greater than approximately 500 nm;

removing the oxidation-resistant layer and the pad layer;

forming a first insulating region and a second insulating region, wherein the first insulating region is a field isolation region that electrically isolates the first portion of the semiconductor layer from the second portion of the semiconductor layer, and wherein the second insulating region is a dielectric for an ESD protection device within the second portion;

forming a gate dielectric layer for a first device over the first portion, wherein the gate dielectric layer is thinner than the dielectric for the ESD protection device;

forming a conductive layer over the gate dielectric layer and the dielectric for the ESD protection device;

patterning the conductive layer to form a gate for the first device and a gate for the ESD protection device; and forming source and drain regions for the first device and ESD protection device, wherein the source and drain regions have a conductivity type opposite the semiconductor layer, wherein the source and drain regions for the first device extend to the insulating layer of the SOI substrate, and wherein the source and drain regions for the ESD protection device extend only partially through a thickness of the second portion of the semiconductor layer.

11. The process of claim 10, wherein:

the step of providing is performed such that the first thickness is no thicker than 500 nm; and the step of forming the source and drain regions is performed such that each of the source and drain regions has a depth in a range from approximately 100–200 nm.

12. The process of claim 10, further comprising a step of forming a source side halo region and a drain side halo region, wherein:

the source side halo region lies within in the second portion of the semiconductor layer adjacent the source region of the ESD protection device;

the drain side halo region lies within the second portion of the semiconductor layer adjacent the drain region of the ESD protection device; and the source side halo region and the drain side halo region have a conductivity type opposite the source and drain regions of the ESD protection device.

13. The process of claim 10, wherein the step of forming the source and drain regions is performed such that each of the source and drain regions has a depth in a range from approximately 100–200 nm.

* * * * *